United States Patent
Montez et al.

(10) Patent No.: US 9,988,260 B2
(45) Date of Patent: Jun. 5, 2018

(54) ROUGH MEMS SURFACE

(71) Applicant: FREESCALE SEMICONDUCTOR, INC., Austin, TX (US)

(72) Inventors: Ruben B. Montez, Austin, TX (US); Arvind S. Salian, Austin, TX (US); Robert F. Steimle, Austin, TX (US)

(73) Assignee: NXP USA, Inc., Austin, TX (US)

( * ) Notice: Subject to any disclaimer, the term of this patent is extended or adjusted under 35 U.S.C. 154(b) by 28 days.

(21) Appl. No.: 15/142,381

(22) Filed: Apr. 29, 2016

(65) Prior Publication Data

US 2017/0313573 A1 Nov. 2, 2017

(51) Int. Cl.
*B81B 3/00* (2006.01)
*B81C 1/00* (2006.01)

(52) U.S. Cl.
CPC .......... *B81B 3/001* (2013.01); *B81C 1/00976* (2013.01); *B81B 2201/0235* (2013.01); *B81B 2203/0315* (2013.01); *B81C 2201/0132* (2013.01); *B81C 2201/115* (2013.01); *B81C 2203/0118* (2013.01)

(58) Field of Classification Search
CPC ............ B81C 1/00158; B81C 1/00182; B81C 1/00468–1/00484; B81C 1/00976; B81C 1/00349; B81C 1/00–1/00992; B81C 2201/0235; B81C 2201/0132; B81C 2201/01; B81C 2203/0118; B81C 2203/01; B81C 2201/115; B81B 3/0035; B81B 3/001; B81B 2201/0235; B81B 2203/0181
See application file for complete search history.

(56) References Cited

U.S. PATENT DOCUMENTS

| | | | |
|---|---|---|---|
| 5,736,430 A * | 4/1998 | Seefeldt | B81C 1/00158 438/53 |
| 6,008,106 A | 12/1999 | Tu et al. | |
| 7,303,936 B2 | 12/2007 | Chilcott | |
| 2005/0042823 A1* | 2/2005 | Chen | H01L 28/84 438/255 |
| 2008/0290494 A1* | 11/2008 | Lutz | B81B 3/0005 257/690 |
| 2014/0167189 A1* | 6/2014 | Steimle | B81B 3/0005 257/415 |
| 2015/0353350 A1* | 12/2015 | Berthelot | B81C 1/00349 438/50 |
| 2016/0176707 A1* | 6/2016 | Montez | B81B 3/001 257/415 |

OTHER PUBLICATIONS

U.S. Appl. No. 14/574,784, filed Dec. 18, 2014 entitled "Reducing MEMS Stiction by Increasing Surface Roughness".

(Continued)

*Primary Examiner* — Eric Ward
*Assistant Examiner* — Eric Ashbahian

(57) ABSTRACT

A surface of a cavity of a MEMS device that is rough to reduce stiction. In some embodiments, the average roughness (Ra) of the surface is 5 nm or greater. In some embodiments, the rough surface is formed by forming one or more layers of a rough oxidizable material, then oxidizing the material to form an oxide layer with a rough surface. Another layer is formed over the oxide layer with the rough surface, wherein the roughness of the oxide layer is transferred to the another layer.

22 Claims, 7 Drawing Sheets

(56) References Cited

OTHER PUBLICATIONS

Maboudian, Roya, "Surface Processes in MEMS Technology", Surface Science Reports, Department of Chemical Engineering, University of California, Berkeley; Oct. 9, 1997.
De Boer, Marten P., "Surface Forces in MEMS—Adhesion and Friction Experiments", MEMS Technologies Dept., Sandia National Laboratories, Albuquerque, NM; Sep. 27-29, 2009.

* cited by examiner

ROUGH MEMS SURFACE

BACKGROUND OF THE INVENTION

Field of the Invention

This invention relates in general to MEMS devices and more specifically to a rough surface for a MEMS device.

Description of the Related Art

Microelectromechanical system (MEMS) devices are devices that include relatively small moving parts. Examples of MEMS devices include accelerometers, gyroscopes, micro-motors, and micro-mechanical switches. In some examples, these devices include moving parts that are made out of semiconductor materials such as silicon.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Described herein are embodiments for forming a rough surfaced for a MEMS device. In one example, the rough surface is formed by forming an oxide layer with a rough surface and then forming a layer of a second material (e.g. silicon) on the roughened oxide layer. In one example, the roughened oxide layer is formed by forming a roughened layer of oxidizable material and then oxidizing the oxidizable material to form the roughened layer of oxide material. The roughness of the oxide layer is transferred to the surface of the layer of the second material. In some embodiments, the surface of the layer of the second material has a roughness that reduces the contact area and is sufficient to prevent or inhibit stiction between the surface and a moving part of the MEMS device.

Stiction is a problem with some MEMS devices where excessive motion of a relatively small moving part can cause the moving part to contact and undesirably stick to another part of the device. Stiction can be caused by the sticking together of two surfaces due to molecular or Van Der Waal forces. In some situations, stiction can cause a MEMS device structure (e.g., a teeter-totter accelerometer moving body) to freeze in place and become unusable. In some embodiments, the smoother the surfaces of the two contacting parts, the more likely the parts are to stick together. Some devices include travel stops (bumps or raised surfaces) that reduce the amount of surface that a moving part may contact with another part. However, stiction may be a problem even with the use of a travel stop if the surface of the travel stop is not sufficiently rough. In general, increasing the roughness of a contact surface reduces the probability of stiction.

Figure 1:
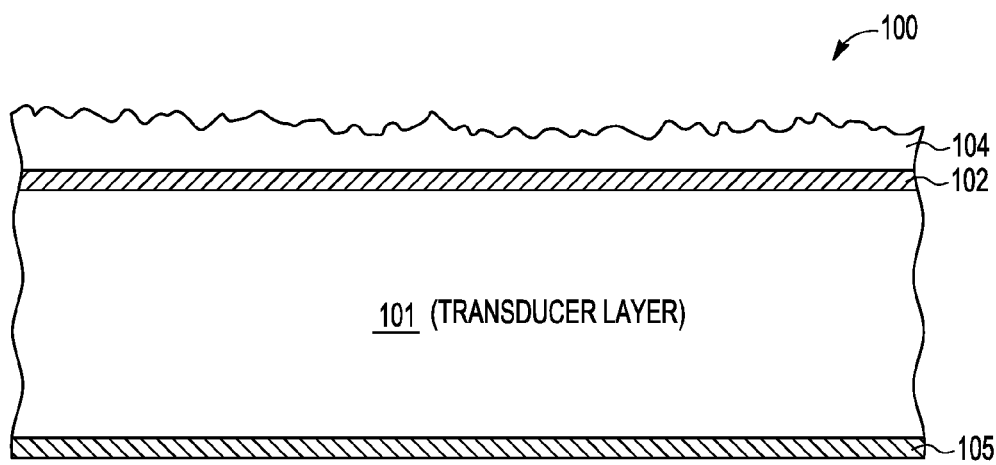
FIGS. 1-9 show partial cutaway side views at various stages in manufacture according to one embodiment of the present invention.

FIGS. 1-9 show partial cutaway side views of various stages in the manufacture of a MEMS device where relatively rough surfaces are formed to help prevent stiction. FIG. 1 shows a partial side view of a transducer wafer 100 that is used to make a MEMS device. Transducer wafer 100 includes a transducer layer 101, which in subsequent stages, a moveable mass of an accelerometer will be formed therefrom. In one embodiment, layer 101 is a layer of monocrystalline silicon having a thickness of 27 microns (after grind & polish processing) and a crystal orientation of (100). In other embodiments, layer 101 may be made of other materials (e.g. silicon germanium) and/or may be of other thicknesses.

Layer 101 was subjected to an oxidation process where a layer 102 of silicon oxide was formed on the top side of layer 101 and a layer 105 of silicon oxide was formed on the bottom side of layer 101. In one embodiment, layers 102 and 105 have a thickness of 150 angstroms (Å), but may have other thicknesses in other embodiments.

After forming layers 102 and 105, a layer of "rough" polysilicon is formed on layer 102. Layer 104 is made rough by depositing the polysilicon layer 104 in the presence of gaseous hydrochloric acid (HCl) to modify the morphology of the polysilicon to result in a roughened surface. In one embodiment, polysilicon layer 104 is deposited on wafer 100 by reacting a silicon containing gas, gaseous HCl, hydrogen ($H_2$), and a dopant gas for a first duration of time at a first temperature in a deposition chamber. In one embodiment, the dopant gas is phosphine ($PH_3$) such that the resulting poly silicon layer 104 is doped with phosphorous. Alternate embodiments may use different dopant gases, such as arsine, or no dopant gas at all. In one embodiment, the Si-containing gas may be silane.

During the deposition, the silane and hydrogen react via pyrolytic decomposition to form silicon. The resultant silicon locally agglomerates on the surface of insulating layer 102 in the form of polysilicon. The addition of HCl to the silane and hydrogen gases decreases the polysilicon growth rate and facilitates locally non-uniform surface polysilicon deposition on the surface of insulating layer 102, thus increasing surface roughness of the resulting polysilicon layer 104. A dopant gas can be added to lower the electrical resistance of the resulting polysilicon layer. In alternate embodiments, the Si-containing gas may be any type of silane (e.g. $SiH_4$, $Si_2H_6$) or chlorinated silane (e.g. $SiH_2Cl_2$, $SiCl_4$, $HSiCl_3$). In one embodiment, the Si-containing gas is a methyl silane ($SiH_3CH_3$) which results in depositing a polysilicon carbide layer.

In one embodiment, the deposition of layer 104 is performed at a temperature of at least 630 degrees Celsius, such as at about 650 degrees Celsius, for a duration of 5 to 15 minutes. In one embodiment, by keeping the temperature at 630 degrees Celsius or greater, the resulting deposited polysilicon layer is ensured to stay in the polysilicon phase while a lesser temperature may result in a mixed phase of polysilicon between polysilicon and amorphous silicon. Due to the ratio of the Si-containing gas (e.g. $SiH_4$) and HCl, resulting layer 104 has a roughness characterized by peaks and valleys of the surface. In one embodiment, the flow of HCl during the deposition is 70 standard cubic centimeters per minute (sccm) and the flow of $SiH_4$ is 290 sccm. This provides a ratio of HCl to $SiH_4$ of 1 to 4.1. That is, HCl is about 19.4% of the total flow of the HCl and $SiH_4$. In another embodiment, the flow of HCl during the deposition is 85 sccm and the flow of SiH4 is 290 sccm, which provides a ratio of HCl to SiH4 of 1 to 3.4. That is, HCl is about 22.7% of the total flow of the HCl and SiH4. In yet another embodiment, the flow of HCl during the deposition is 55 sccm and the flow of SiH4 is 290 sccm, which provides a ratio of HCl to SiH4 of 1 to 5.3. That is, HCl is about 15.9% of the total flow of the HCl and SiH4. Therefore, in one embodiment, in order to achieve the desired surface roughness during the deposition of the polysilicon, the percentage of HCl of the total flow of HCl and the silicon-containing gas may be at least 15%, or alternatively, at least 18 percent, or alternatively at least 20%, or alternatively, at least 22%. The percentage of HCl of the total flow of HCl and the silicon-containing gas may be in a range of 15% to 23%, or alternatively, 16% to 22%, or alternatively, 18% to 21%, or alternatively 18% to 23%.

In other embodiments, the ratio HCL to silicon-containing gas may be different for different deposition temperatures and pressures. In some embodiments, the percentage of HCl of the total flow of HCl and the silicon-containing gas may be may be higher than 23% (e.g. up to 30%).

Still referring to the deposition of layer 104, the ratio between the silicon (Si) source and the H2 and HCl gases determines the thickness and resulting roughness of polysilicon layer 104. In one embodiment, the flow of H2 during the deposition is 35 standard liters per minute (slm). In one embodiment, a mean thickness of layer 104 is 40 nm, having a tallest peak of at least 55 nm (e.g., about 60 nm) and a lowest valley of at most 35 nm (e.g., about 30 nm), as measured from the top surface of insulating layer 102. In one embodiment, the difference between the tallest peak and lowest valley is in a range of 20 to 30 nm. However, layer 104 maybe formed by different processes in other embodiments. In one embodiment, layer 104 has a thickness of 3000 A, but may have other thicknesses in other embodiments. Still on other embodiments, layer 104 may be made of another oxidizable material (e.g. germanium, silicon germanium).

Figure 2:
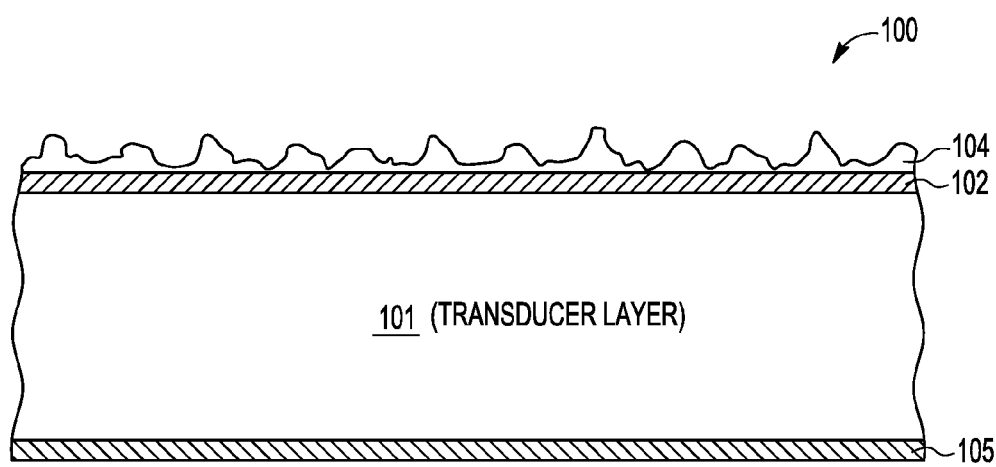

FIG. 2 is a partial cross sectional side view of wafer 100 after the rough poly silicon layer 104 has been etched back to reduce the thickness and increase the roughness of the layer. In one embodiment, the etch back is performed while wafer 100 remains in the same chamber (not shown) in which layer 104 was deposited. After deposition, the temperature of the chamber is raised to a second temperature and an etch back is performed using HCl and H2 at a temperature of at least 950 degrees Celsius for a second duration of time. The temperature for the etch back is greater than the temperature of the previous deposition of layer 104. In one embodiment, the etch back is performed at the second temperature for 10-40 seconds. Also, the flow of H2 during etch back may be 35 slm and the flow of HCl may be 200 sccm. During the etch back, layer 104 is further roughened by removing some of the polysilicon. Therefore, portions of oxide layer 102 may be exposed between raised portions of polysilicon layer 104 and the peaks are reduced in height. In one embodiment, the thickness of the amount of layer 104 is reduced at the peaks in a range from 15 nm to 30 nm, whereas the thickness of the amount of layer 104 is reduced at the valleys in the range from 0 nm to 15 nm. In some embodiments, valleys of layer 104 may be etched to layer 102. In one embodiment, the etch back may be performed in the presence of a silicon containing gas (e.g. silane) to modulate the silicon grain morphology during the surface etch back.

Figure 3:
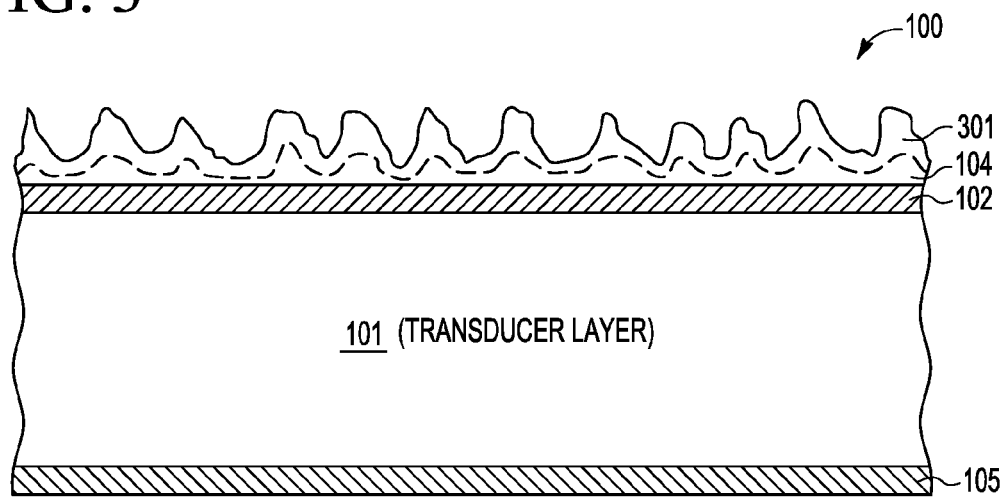

FIG. 3 shows a partial cross sectional side view of wafer 100 after a second layer 301 of rough poly silicon is formed on layer 104 after the etch back. In one embodiment, the processes described in depositing layer 104 are repeated a second time to form layer 301. The subsequent polysilicon deposition is performed at the first temperature for the first duration of time by reacting the Si-containing gas, gaseous HCl, H2, and the dopant gas, resulting in a polysilicon layer 301 being formed on polysilicon layer 104. The descriptions, parameters, and alternatives described for the first deposition to form polysilicon layer 104 described in reference to FIG. 1 apply to the subsequent deposition described with respect to FIG. 3. In one embodiment, layer 301 is deposited in the same chamber as layer 104. After the subsequent deposition of layer 301, a mean thickness of layer 301 in combination with layer 104 is 60 nm, having a tallest peak of about 120 nm and a lowest valley of about 70 nm, as measured from the top surface of oxide layer 102. In one embodiment, the difference between the tallest peak and lowest valley is in a range of 40 to 60 nm.

After the deposition of rough poly silicon layer 301 (and after the stage shown in FIG. 3) a second etch back is performed. The second etch back is performed at the second temperature for the second duration of time by using HCl and H2 (and a silicon containing gas in some embodiments). In one embodiment, the descriptions, parameters, and alternatives described for the first etch back described with respect to FIG. 2 apply to the second etch back. After the second etch back, a mean thickness of the combined layer of 301 and 104 is 60 nm, having a tallest peak of about 90 nm and a lowest valley of about 40 nm, as measured from the top surface of layer 102. In one embodiment, the difference between the tallest peak and lowest valley is in a range of 40 to 70 nm. In some embodiments, the wafer surface may be etched back such that portions of transducer layer 101 may be exposed at locations corresponding to the valleys of layer 301. In some embodiments, a different etchant is used to etch through those portions of $SiO_2$ layer 102.

In the illustrated embodiment of FIGS. 1-3 and description thereof, the deposition and etch back is performed twice. In another embodiment, the deposition and etch back are performed only once. In still other embodiments, the deposition and etch back processes are performed more than twice, such as three times, in order to achieve the desired roughness of the resulting polysilicon layer (e.g. 301 and 104 in FIG. 3). In some embodiments, the second etch back is not performed. In one embodiment, all depositions and etch backs are performed in the same chamber.

Figure 4:
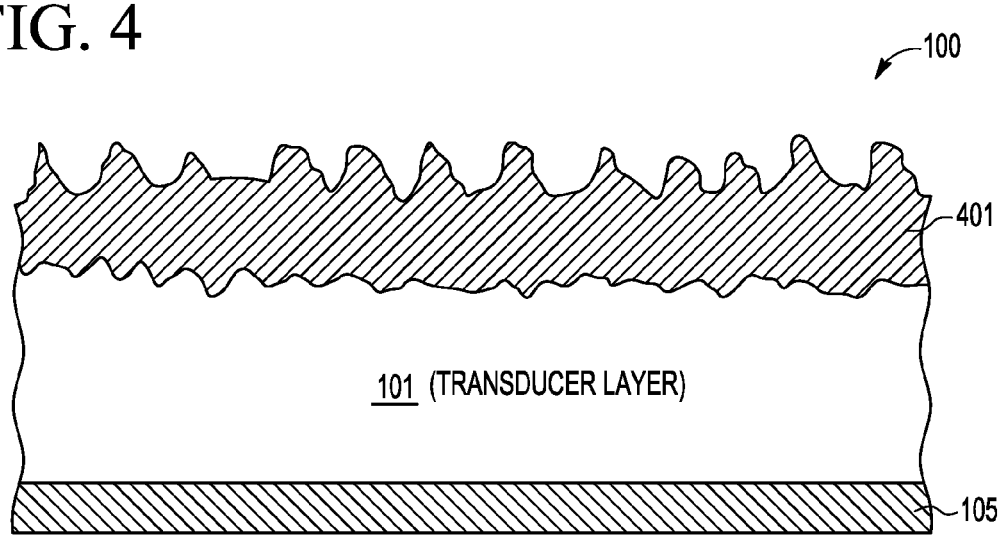

FIG. 4 is a partial cutaway side view of wafer 100 after wafer 100 has been subjected to an oxidizing process to oxidize layers 301 and 104 into layer 401. In one embodiment, the oxidation of layers 104 and 301 is performed in a steam oxidation chamber at a temperature in the range of 1000°+/−100° C. for 10 to 30 hours. During the oxidation process, portions of layer 101 are further oxidized increasing the thickness of layer 105. Also a portion of the thickness of layer 401 comes from the oxidation of layer 101. Layer 401 also includes a portion of layer 102.

As a result of the oxidation of rough poly layers 301 and 104, the upper surface (relative to the view shown in FIG. 4) of layer 401 has a rough surface as well. In one embodiment, the difference between the peaks and valleys of the upper surface of layer 401 is between 65 nm to 115 nm. In some embodiments, the average roughness ($R_a$) of the upper surface of layer 401 is in the range of 5 nm to 50 nm. In other embodiments, the upper surface of layer 401 may have an average roughness (Ra) outside of that range.

Figure 5:
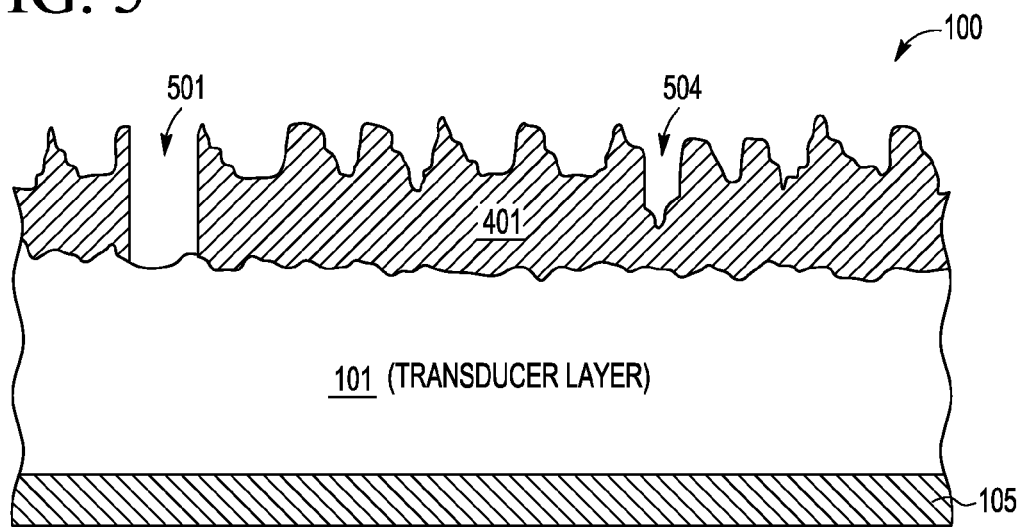

FIG. 5 is a partial cutaway side view of wafer 100 after openings 501 and 504 are formed in layer 401. Opening 501 will be used for subsequently forming an anchor (605) to a fixed structure formed from transducer layer 101. Opening 504 will be utilized for forming a travel stop (607). In one embodiment, a first mask (not shown) is formed over wafer 100 with a patterned opening for forming opening 504. A timed etch is performed using an etch chemistry (e.g. a buffered oxide etch, diluted HF, or Dry Etch) that is selective to SiO2 to form opening 504. The etching of opening 504 reduces the thickness of the uneven surface in the opening. However, the resulting surface at the bottom of opening 504 is also uneven. In one embodiment, opening 501 has a width of 0.5 microns and opening 504 has a width of 0.5 microns, but they may have other widths in other embodiments.

After the formation of opening 504, opening 501 is formed by forming a second mask (not shown) with an opening at the location of opening 504 and performing an etch with an appropriate chemistry. For example, a dry plasma etch using an etch chemistry of Argon, CF4, or CHF3 may be used. Because opening 504 is used for forming an anchor, the etch is performed all of the way to transducer layer 101.

In other embodiments, openings 501 and 504 may be performed by other processes. For example, opening 501 may be formed before opening 504. Also in other embodiments, one mask may be used to form both openings where the opening in the first mask for opening 501 is first made first followed by a timed etch of layer 401. Then the opening in the mask for opening 504 is made where a timed etch is performed for a second time to form opening 504.

Figure 6:
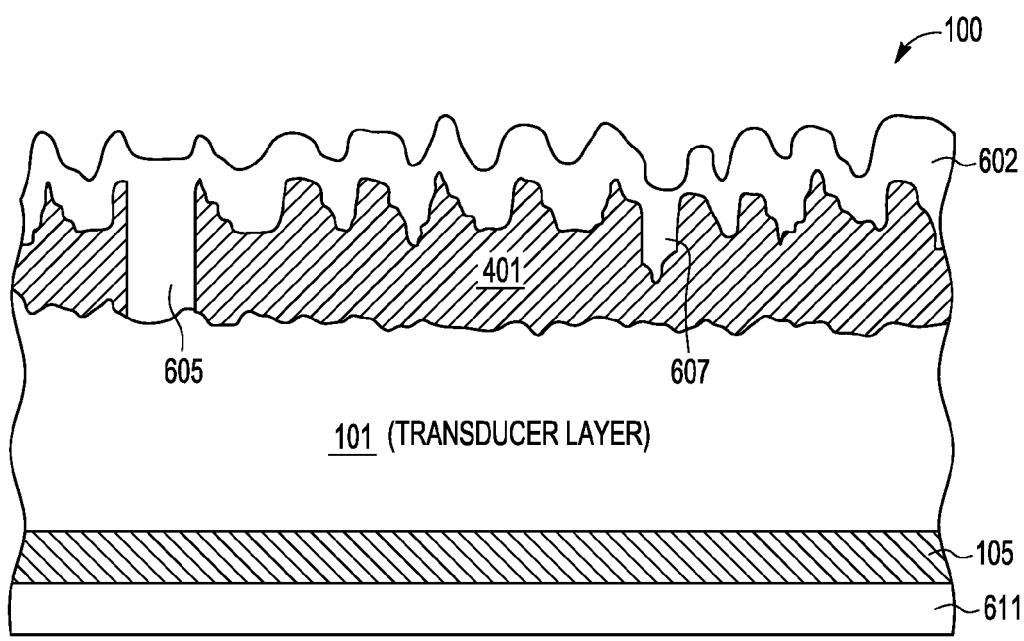

FIG. 6 shows a partial cutaway side view of wafer 100 after a layer 602 of rough poly silicon is formed on layer 401. In one embodiment, layer 602 has a thickness of 3000 Å, but may be of other thicknesses in other embodiments. During the deposition of layer 602, polysilicon is also formed in opening 501 to form anchor 605 and formed in opening 504 to form travel stop 607. Anchor 605 contacts transducer layer 101.

Because layer 602 is formed on rough silicon dioxide layer 401, the bottom surface (relative to the view shown in FIG. 6) of layer 602 is correspondingly rough. In one embodiment, the difference between the peaks and valleys of the bottom surface of layer 602 is 65 nm to 115 nm. In some embodiments, the average roughness ($R_a$) of the bottom surface of layer 602 is in the range of 5 nm to 50 nm. In other embodiments, the bottom surface of layer 602 may have an average roughness ($R_a$) outside of that range (either higher or lower). Because opening 504 was formed with a partial etch, the bottom surface (relative to the view of FIG. 6) of travel stop 607 also has the same roughness as the bottom surface of the remaining portion of layer 602, as opposed to being a smooth surface.

In the embodiment shown, layer 602 is a conformal layer. Accordingly, in some embodiments, the average roughness ($R_a$) of the top surface (relative to the view of FIG. 6) of layer 602 is in the range of 5 nm to 50 nm.

In some embodiments, a layer 602 may be patterned to form electrodes (not shown). In one embodiment, the electrodes serve as fixed capacitive plate structures for sensing capacitance (e.g. as with a teeter-totter accelerometer). In some embodiments, layer 602 may be made of other materials. In still other embodiments, an intervening conformal layer (e.g. nitride or a conductive material) (not shown) may be formed between layer 602 and layer 401. The intervening layer may or may not be removed during a subsequent removal of layer 401 (see FIG. 9).

In the embodiment shown, during the formation of layer 602, a layer 611 of polysilicon is also formed on the bottom of layer 105. However in other embodiments, only layer 602 would be formed. In still other embodiments, layer 602 may be made of other materials.

Figure 7:
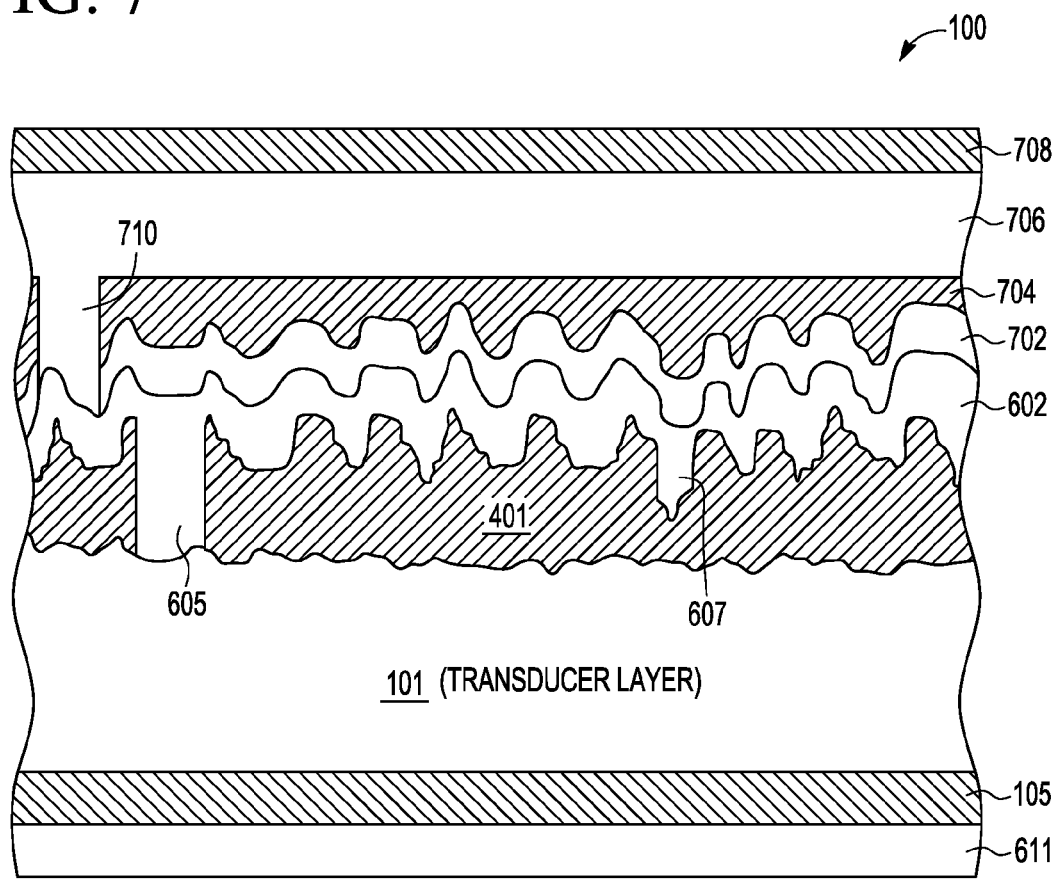

FIG. 7 shows a partial side cutaway view of wafer 100 after a silicon nitride layer 702, oxide layer 704, a second poly silicon layer 706, and top oxide layer 708 are formed on wafer 100. Layer 702 is formed by depositing silicon nitride on layer 602. In one embodiment, layer 702 is 3500 Å thick, but may be of other thicknesses in other embodiments. In one embodiment, layer 702 is formed by a chemical vapor deposition (CVD) process. After the formation of layer 702, a layer of silicon oxide 704 is deposited on layer 702. In one embodiment, layer 704 is formed by a CVD process. In one embodiment, layer 708 has a thickness of 2 microns, but may have other thicknesses in other embodiments.

In the embodiment shown, after deposition, layer 704 is planarized (e.g. by a CMP process). Openings are then formed in layer 704 and 702 (e.g. with a patterned mask not shown) for the formation of vias (e.g. 710) to contact layer 602. After the formations of the via openings, a second layer 706 of polysilicon (poly2) is formed over layer 704. In forming layer 706, polysilicon in formed in the openings to form vias (e.g. 710) that electrically couple layer 706 to structures of layer 602. After the formation, layer 706 may be planarized and patterned to form interconnects or other conductive structures. In one embodiment, layer 706 is 2 microns thick, but may be of other thicknesses in other embodiments.

Afterwards, oxide layer 708 is formed on poly layer 706 by e.g. a CVD process. In one embodiment, layer 706 is 1 micron thick, but may be of other thicknesses in other embodiments.

Figure 8:
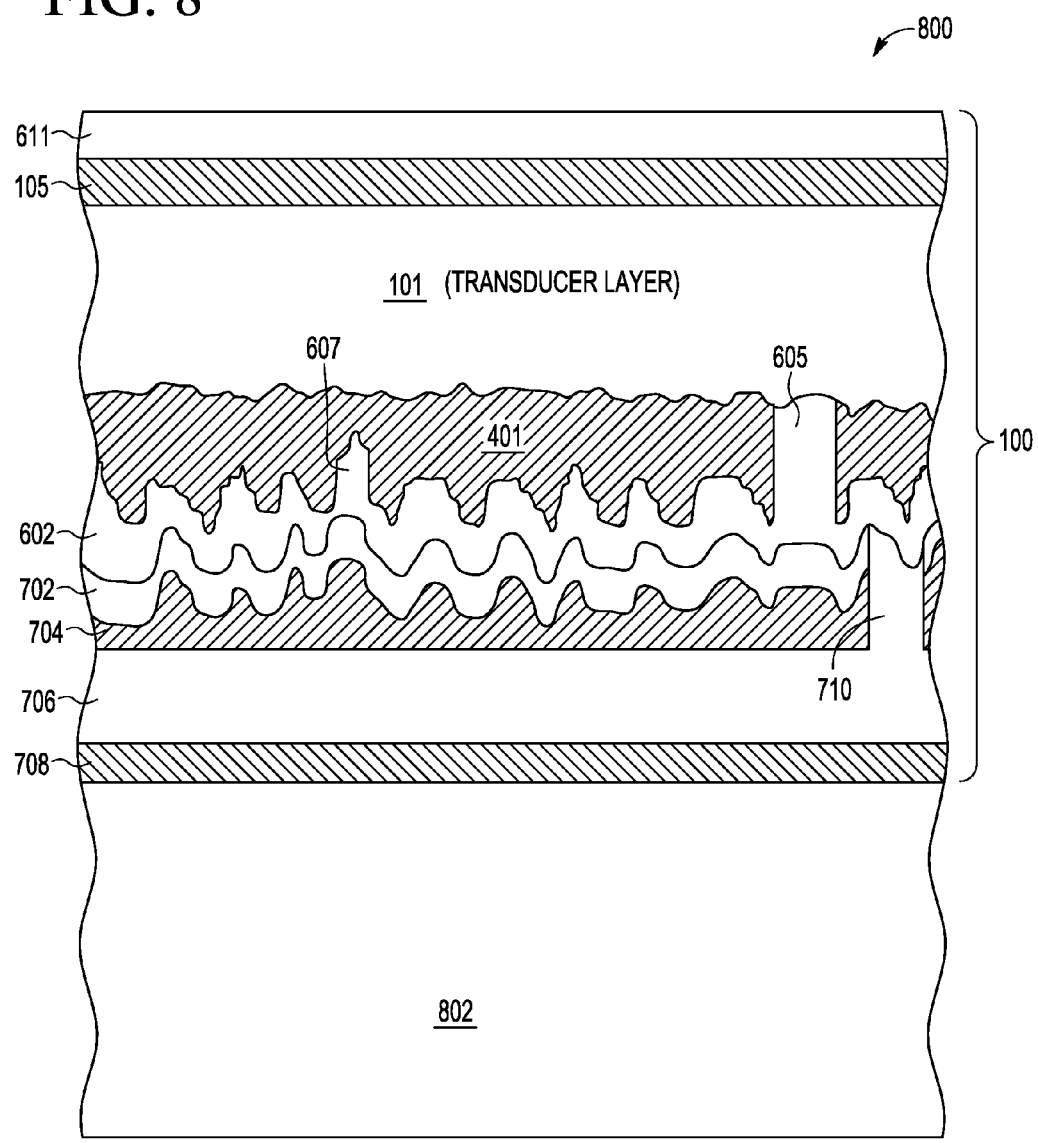

FIG. 8 is a partial cutaway side view after wafer 100 has been inverted and bonded to a handle wafer 802 to form composite wafer 800. In one embodiment, handle wafer 802 is made of monocrystalline silicon, but may be made by other materials in other embodiments. In one embodiment, wafer 100 and wafer 802 are joined via a direct bond technique. After direct bond, the joined wafers are annealed at a high temperatures (e.g. >1000 C).

Figure 9:
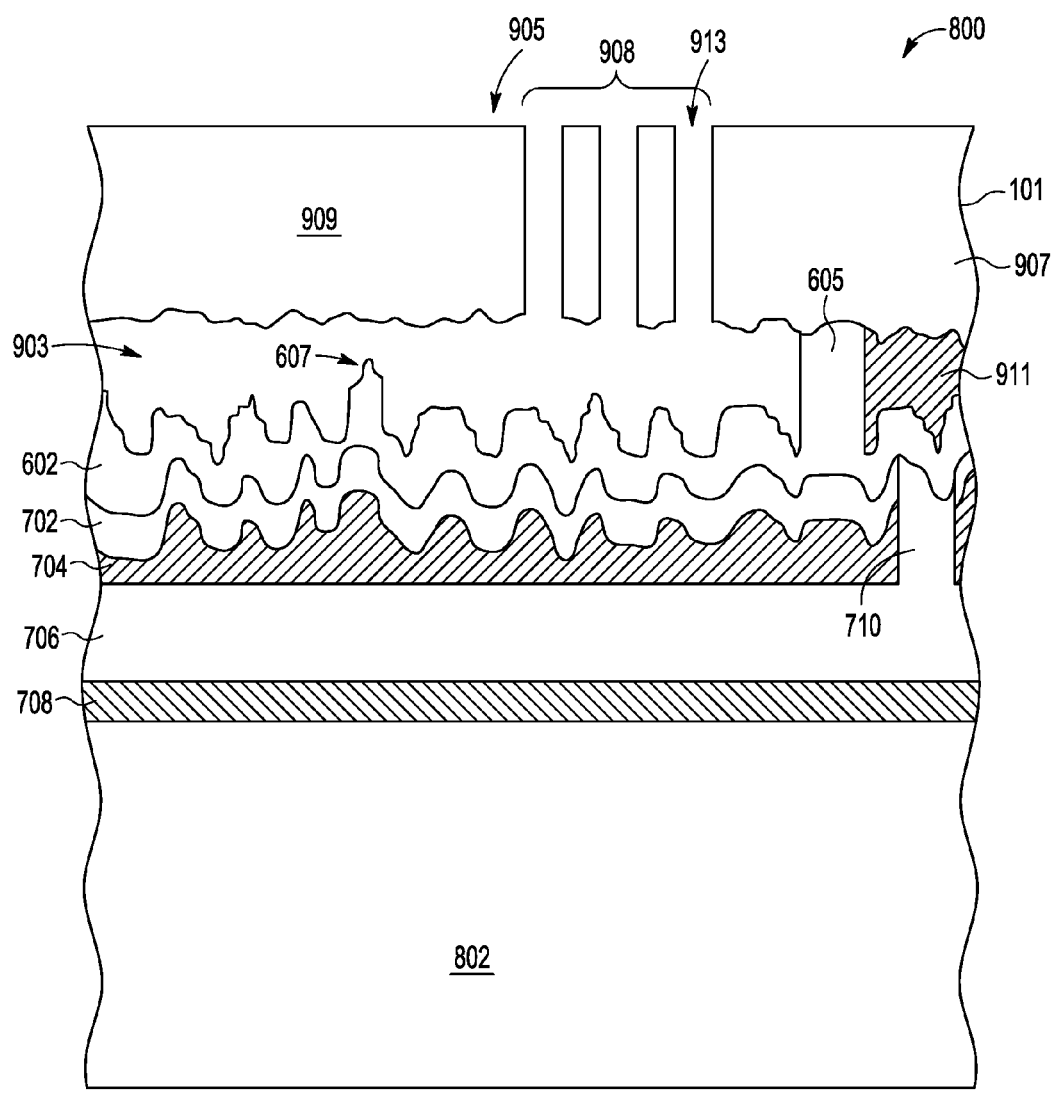

FIG. 9 is a partial side cutaway view of wafer 800 after transducer layer 101 has been patterned to form a transducer 905. Prior to forming transducer 905 from layer 101, layers 611 and 105 are removed (e.g. by etching with appropriate etch chemistries or by planarization). In one embodiment, transducer 905 is an accelerometer type transducer that includes springs (e.g. 908) that flexibly couple movable transducer body 909 (a portion as shown in FIG. 9) to fixed transducer structure 907. In one embodiment, the springs 908 and moving transducer body 909 are formed by forming openings (913) in transducer layer 101.

After the formation of openings 913 in the transducer layer 101, portions of oxide 401 are exposed to a wet or vapor phase etchant through openings 913 for removal to release the transducer body 909 for movement. In one embodiment, a vapor phase chemistry of gaseous HF and methanol can be used. The removal of portions of layer 401 creates a void 903. In the embodiment shown, portions 911 of layer 401 are not removed in that they are protected from the etchant by anchor 605.

As shown in FIG. 9, travel stop 607 extends up from the surface of layer 602. Because it was formed over a rough oxide surface, the top surface of stop 607 in FIG. 9 is not smooth but is instead rough. Having a travel stop with a rough surface inhibits stiction from resulting between the movable transducer body 909 and stop 607 that may occur from contact between body 909 and stop 607 during a shock or hard jolt to a system that implements the transducer.

In other embodiments, a resultant transducer formed from wafer 800 does not include travel stops (607). Even without the travel stops 607, the rough surface of layer 602 prevents stiction from occurring between movable transducer body 909 and the exposed surface of rough poly layer 602.

After the patterning of layer 101 and the removal of oxide from layer 401, a cap wafer (not shown) is bonded to structures of transducer layer 101 to enclose and seal transducer body 909. In one embodiment, the cap wafer may be made of single crystal silicon and have a cavity located over the transducer body.

In other embodiments, the cap wafer may include an integrated circuit such as an ASIC, which contains control and measurement circuitry for the transducer. Layer 101 may contain conductor structures (not shown) for coupling to the circuitry of cap wafer.

In still other embodiments, the transducer may be sealed by other structures. For example, after patterning layer 101 to form openings 913, a layer of a sacrificial oxide may be deposited over layer 101. An addition layer of a different material would be deposited over the layer of sacrificial oxide. A hole formed would be formed in the layer of additional material or from the bottom to expose the sacrificial oxide. The wafer would be subject a wet etchant that would remove the sacrificial oxide and portions of layer 401. Afterwards, the hole would be sealed.

After the enclosing and sealing of the transducer, the wafer is singulated into multiple die with each die (see die 1001 of FIG. 10) including a transducer structure as made the processes shown in FIGS. 1-9. In some embodiments, the die can be further packaged with a control system die in an encapsulant. In such embodiments, conductive structures of the transducer (e.g. body 909, electrodes not shown) would be electrically coupled to circuitry of the control system to provide signals representing values of the parameters being measured. The resultant package can then be implemented in a system (e.g. motor vehicle, phone, or appliance). In some embodiment, the die may be implemented without packaging.

Figure 10:
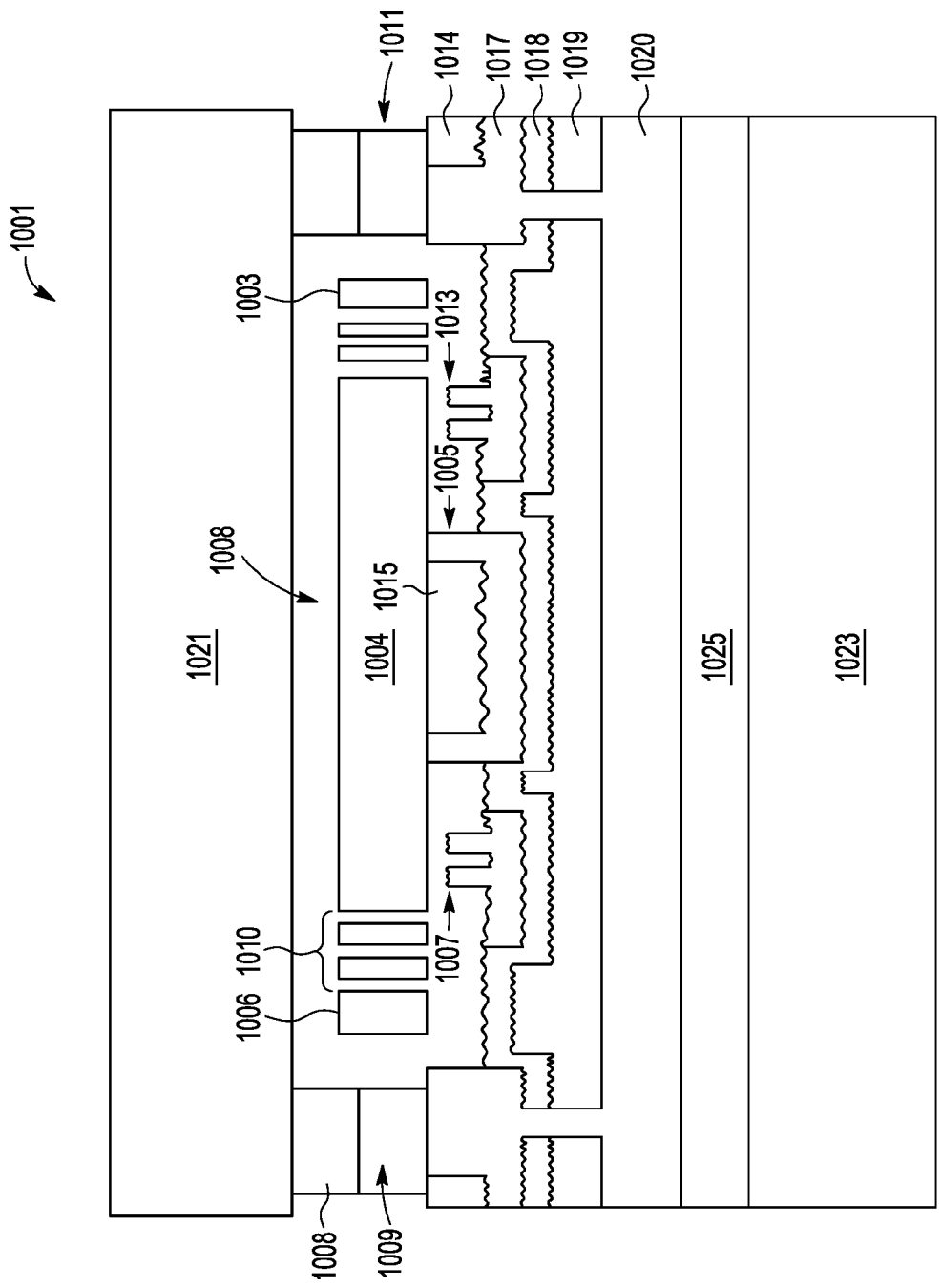
FIG. 10 is a cut away side view of a MEMS device according to one embodiment of the present invention.

FIG. 10 is a cutaway side view a transducer die that was made by processes similar to those describe with respect to FIGS. 1-9. Die 1001 includes a transducer 1003 made from a transducer layer similar to layer 101. Transducer 1003 includes a fixed structure 1004 physically attached to anchor 1005 and springs 1010 that couple fixed structure 1004 to a movable structure 1006.

Travel stops 1007 and 1013 are made from a layer 1017 of rough polysilicon which is formed similarly to layer 602. The travel stops 1007 and 1013 have rough top surfaces which prevent stiction with the surfaces of transducer 1003. In the embodiment shown, rough poly layer 1017 has been patterned where portions of layer 1017 have been removed. Silicon nitride layer 1018 fills the openings where portions of layer 1017 have been removed. In some embodiments, the upper surface of those portions of layer 1018 that are exposed to cavity 1008 would have approximately the same average roughness (Ra) as the exposed upper surface of layer 1017 in that those portions of layer 1018 were formed on layer 1014 prior to its removable.

Silicon nitride layer 1018, oxide layer 1019, poly silicon layer 1020 (Poly2), oxide layer 1025, and handle structure 1023 are similarly formed as layer 702, layer 704, layer 706, layer 708, and wafer 802 in the embodiment of FIGS. 1-9.

Die 1001 includes a cap 1021 that is physically bonded to a silicon structure 1009 which was formed from transducer layer 1011. Attached to cap 1021 is a layer of aluminum germanium that bonds with the silicon structure 1009 to form a eutectic bond that seals transducer 1003 in cavity 1008. Movable transducer structure 1006 is allowed to move freely within cavity 1008. Cap 1021 may include through silicon vias (TSVs) and an external metal routing layer to provide for wirebond or contacts to external control circuitry. In other embodiments, cap 1021 may include control and/or measurement circuitry (not shown) that may be electrically coupled to transducer 1003

In other embodiments, a rough surface for a travel stop or other surface facing a transducer structure may be formed by other methods and or have other configurations.

In the embodiment shown in FIG. 10, the MEMS device is an inertial type accelerometer for measuring forces acting on the die. However, in other embodiments, other types of MEMS devices (e.g. gyroscopes, teeter-totter accelerometers, micro-mechanical switches, micro-motors, pressure sensors, micro mirrors, or other types of transducers) may include rough surfaces as disclosed herein.

In some embodiments, forming a rough polysilicon surface by depositing a layer of polysilicon on a rough oxide layer may advantageously provide for a rougher polysilicon surface as opposed to forming a layer of polysilicon and roughing its surface.

In one embodiment, a method of forming an exposed surface for a MEMS device includes forming a layer of oxidizable material over a substrate layer. The method includes oxidizing the layer of oxidizable material. The oxidizing forms an oxide layer. The oxide layer has a top surface. The method includes forming a layer of a first material over the oxide layer. The method includes exposing at least a portion of the layer of the first material wherein the exposing includes removing at least a portion of the oxide layer. The MEMS device includes a cavity. An exposed portion of the layer of first material defines a portion of the cavity.

In other embodiment, A MEMS device includes a MEMS device structure in a cavity of the MEMS device. The MEMS device structure is movable in the cavity. The MEMS device includes a layer having a first surface defining a portion of the cavity. The layer has a second surface opposing the first surface. The first surface and the second surface each have an average roughness (Ra) of 5 nm or greater.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming an exposed surface for a MEMS device, the method comprising:
   forming a layer of oxidizable material over a substrate layer;
   oxidizing the layer of oxidizable material, wherein the oxidizing forms an oxide layer, the oxide layer has a top surface;
   forming a layer of a first material over the oxide layer;
   exposing at least a portion of the layer of the first material wherein the exposing includes removing at least a portion of the oxide layer;

wherein the MEMS device includes a cavity, wherein an exposed portion of the layer of first material defines a portion of the cavity, and wherein forming the layer of oxidizable material includes depositing the oxidizable material of the layer of oxidizable material in the presence of a gaseous hydrochloric acid in which a silicon containing gas is used as a reactant in the depositing, and wherein the percentage of the gaseous hydrochloric acid of a total flow of the gaseous hydrochloric acid and the silicon containing gas is at least 15%.

2. The method of claim 1 further comprising:

forming a partial opening in the oxide layer prior to forming the layer of a first material, wherein a thickness of the oxide layer is reduced at the partial opening, wherein the forming the layer of the first material includes filling the partial opening with the first material, wherein the first material filled in the partial opening defines a travel stop in the cavity.

3. The method of claim 2 wherein the travel stop has a top surface with an average roughness ($R_a$) in a range of 5 nm to 50 nm.

4. The method of claim 1 wherein the exposed portion of the layer of the first material has an average roughness ($R_a$) in a range of 5 nm to 50 nm.

5. The method of claim 1 wherein the percentage of the gaseous hydrochloric acid of the total flow of the gaseous hydrochloric acid and the silicon containing gas is in a range of 15%-30%.

6. The method of claim 1 wherein the percentage of the gaseous hydrochloric acid of the total flow of the gaseous hydrochloric acid and the silicon containing gas is in a range of 18%-23%.

7. The method of claim 1 wherein the forming the layer of oxidizable material includes using a dopant containing gas as a reactant in the depositing oxidizable material of the layer of oxidizable material.

8. The method of claim 1 wherein the forming the layer of oxidizable material comprises:

depositing a first layer of oxidizable material;
partially etching the first layer of oxidizable material to reduce a thickness of the first layer of oxidizable material;
depositing a second layer of oxidizable material on the partially etched first layer of oxidizable material.

9. The method of claim 8 wherein a roughness of the first layer of oxidizable material after depositing is less than a roughness of the second layer of oxidizable material after depositing.

10. The method of claim 8 wherein the forming the layer of oxidizable material comprises:

partially etching the second layer of oxidizable material to reduce a thickness of the second layer of oxidizable material.

11. The method of claim 1 wherein the substrate layer is part of a first wafer, wherein the method further comprises:

after the forming a layer of the first material over the oxide layer, attaching the first wafer to a second wafer, wherein the exposing is performed after the first wafer is attached to the second wafer and the first wafer is in an inverted position.

12. The method of claim 1 further comprising:

prior to the exposing, patterning the substrate layer to form a MEMS device structure, wherein after the exposing, the MEMS device structure is movable.

13. The method of claim 12 further comprising:

forming a partial opening in the oxide layer prior to forming the layer of a first material, wherein a thickness of the oxide layer is reduced at the partial opening, wherein the forming the layer of first material includes filling the partial opening with the first material, wherein the first material filled in the partial opening defines a travel stop in the cavity;

wherein the travel stop is positioned in the cavity to prevent the movable MEMS device structure from contacting an exposed surface of the layer of the first material immediately adjacent to the travel stop.

14. The method of claim 1 wherein the layer of the first material is characterized as polysilicon.

15. A method of forming an exposed surface for a MEMS device, the method comprising:

forming a layer of oxidizable material over a substrate layer;
oxidizing the layer of oxidizable material, wherein the oxidizing forms an oxide layer, the oxide layer has a top surface;
forming a layer of a first material over the oxide layer;
exposing at least a portion of the layer of the first material wherein the exposing includes removing at least a portion of the oxide layer;
wherein the MEMS device includes a cavity, wherein an exposed portion of the layer of first material defines a portion of the cavity, and
wherein the forming the layer of oxidizable material comprises depositing a first layer of oxidizable material, partially etching the first layer of oxidizable material to reduce a thickness of the first layer of oxidizable material, and depositing a second layer of oxidizable material on the partially etched first layer of oxidizable material.

16. The method of claim 15 wherein a roughness of the first layer of oxidizable material after depositing is less than a roughness of the second layer of oxidizable material after depositing.

17. The method of claim 15 wherein the forming the layer of oxidizable material comprises:

partially etching the second layer of oxidizable material to reduce a thickness of the second layer of oxidizable material.

18. The method of claim 15 further comprising:

forming a partial opening in the oxide layer prior to forming the layer of a first material, wherein a thickness of the oxide layer is reduced at the partial opening, wherein the forming the layer of the first material includes filling the partial opening with the first material, wherein the first material filled in the partial opening defines a travel stop in the cavity.

19. The method of claim 15 wherein the exposed portion of the layer of the first material has an average roughness ($R_a$) in a range of 5 nm to 50 nm.

20. The method of claim 15 wherein the substrate layer is part of a first wafer, wherein the method further comprises:

after the forming a layer of the first material over the oxide layer, attaching the first wafer to a second wafer, wherein the exposing is performed after the first wafer is attached to the second wafer and the first wafer is in an inverted position.

21. The method of claim 15 further comprising:

prior to the exposing, patterning the substrate layer to form a MEMS device structure, wherein after the exposing, the MEMS device structure is movable.

22. The method of claim 15 wherein the layer of the first material is characterized as polysilicon.

* * * * *